United States Patent [19]
Mizouchi

[11] Patent Number: 5,926,257
[45] Date of Patent: Jul. 20, 1999

[54] ILLUMINATION OPTICAL SYSTEM AND EXPOSURE APPARATUS HAVING THE SAME

[75] Inventor: Satoru Mizouchi, Utsunomiya, Japan

[73] Assignee: Canon Kabushiki Kaisha, Tokyo, Japan

[21] Appl. No.: 08/898,576

[22] Filed: Jul. 22, 1997

[30] Foreign Application Priority Data

Jul. 24, 1996 [JP] Japan .................................. 8-214294

[51] Int. Cl.⁶ ........................... G03B 27/54; G03B 27/32
[52] U.S. Cl. ............................................. 355/67; 355/77
[58] Field of Search .................................. 355/43, 53, 67, 355/71, 77; 250/492.22; 356/399, 400, 401

[56] References Cited

U.S. PATENT DOCUMENTS

| | | | |
|---|---|---|---|
| 4,617,469 | 10/1986 | Takahashi et al. | 250/548 |
| 4,659,225 | 4/1987 | Takahashi | 356/358 |
| 4,682,885 | 7/1987 | Torigoe | 355/67 |
| 4,851,882 | 7/1989 | Takahashi et al. | 355/46 |
| 4,874,954 | 10/1989 | Takahashi et al. | 250/548 |
| 4,939,630 | 7/1990 | Kikuchi et al. | 362/268 |
| 4,974,919 | 12/1990 | Muraki et al. | 350/6.6 |
| 5,091,744 | 2/1992 | Omata | 355/53 |
| 5,097,291 | 3/1992 | Suzuki | 355/69 |
| 5,121,160 | 6/1992 | Sano et al. | 355/53 |
| 5,153,773 | 10/1992 | Muraki et al. | 359/619 |
| 5,245,384 | 9/1993 | Mori | 355/67 |
| 5,263,250 | 11/1993 | Nishiwaki et al. | 29/890.1 |
| 5,335,044 | 8/1994 | Shiraishi | 355/53 |
| 5,695,274 | 12/1997 | Kamihara | 362/268 |
| 5,699,148 | 12/1997 | Shiozawa | 355/71 |
| 5,719,617 | 2/1998 | Takahashi et al. | 347/241 |
| 5,745,294 | 4/1998 | Kudo | 359/618 |
| 5,798,824 | 8/1998 | Kudo | 355/67 |
| 5,815,248 | 9/1998 | Nishi et al. | 355/71 |
| 5,828,496 | 10/1998 | Nishiwaki et al. | 359/626 |

FOREIGN PATENT DOCUMENTS

0 486 316 A3  5/1992  European Pat. Off. .

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

An illumination optical system includes a first diffraction optical element, a second diffraction optical element and a condenser lens. The first diffraction optical element has a plurality of micro diffraction optical elements, which have a first optical power in a first direction and an optical power different from the first optical power in a second direction, perpendicular to the first direction. The second diffraction optical element has a plurality of micro diffraction optical elements, which have a second optical power in the second direction and an optical power different from the second optical power in the first direction. The first optical power is different from the second optical power. Light supplied from a light source forms a plurality of secondary light sources by passing through the first and second diffraction optical elements. Light from the secondary light sources passing through the condenser lens generates Kohler illumination on a surface to be irradiated.

18 Claims, 6 Drawing Sheets

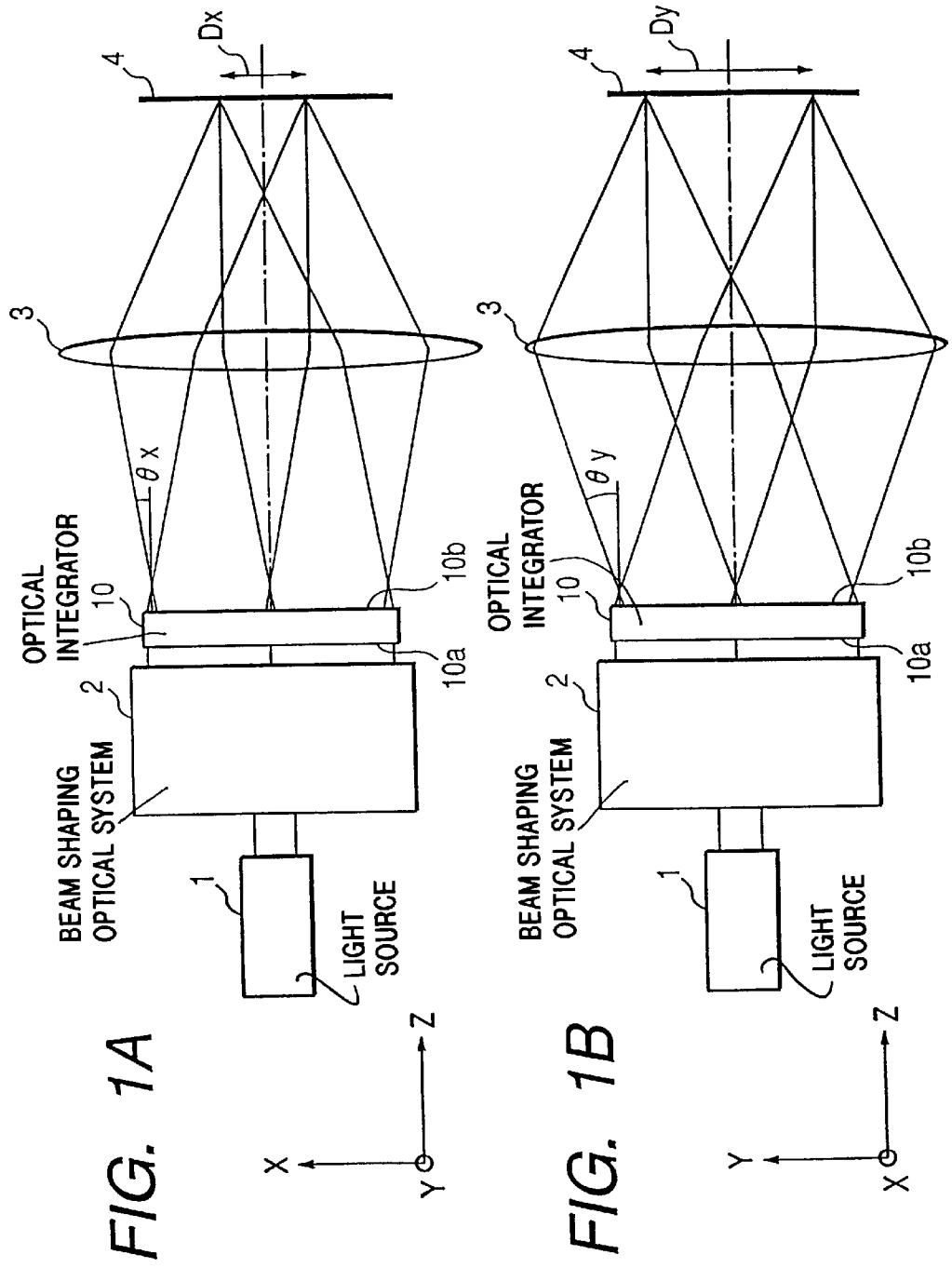

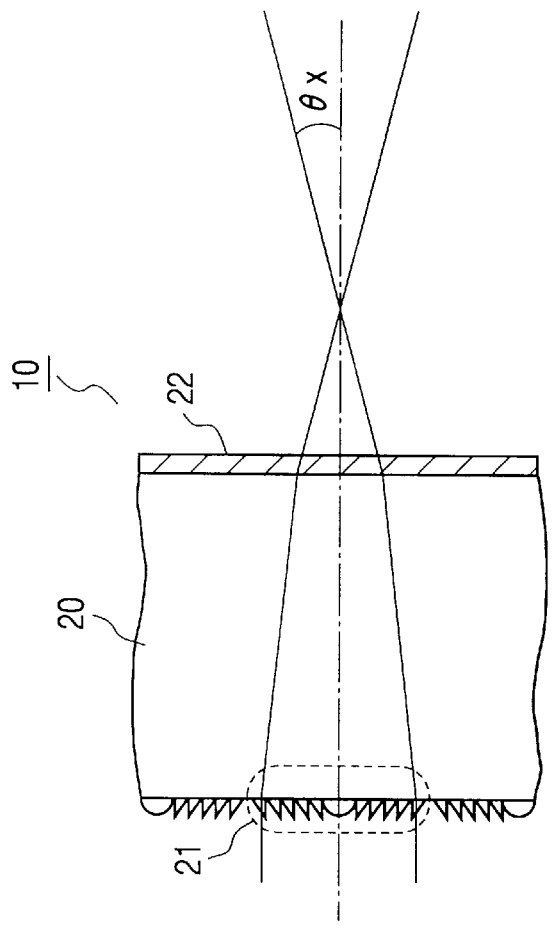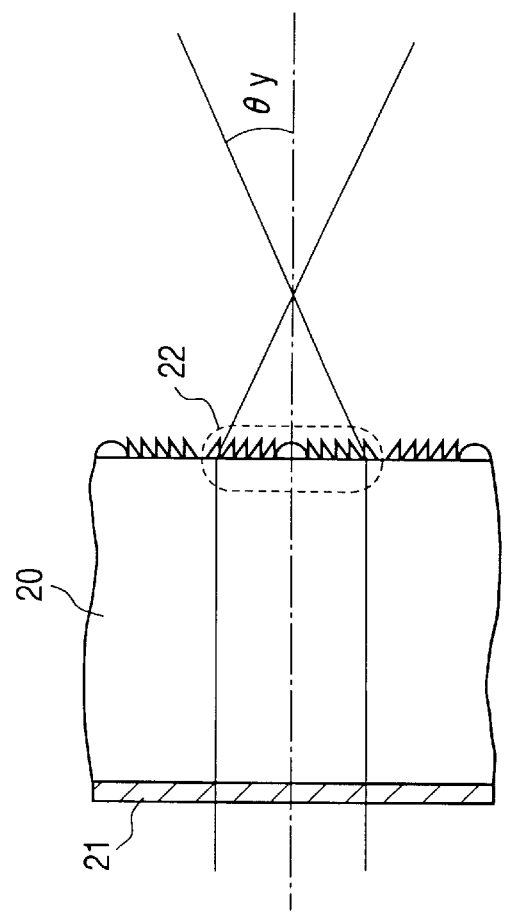
FIG. 2A
FIG. 2B

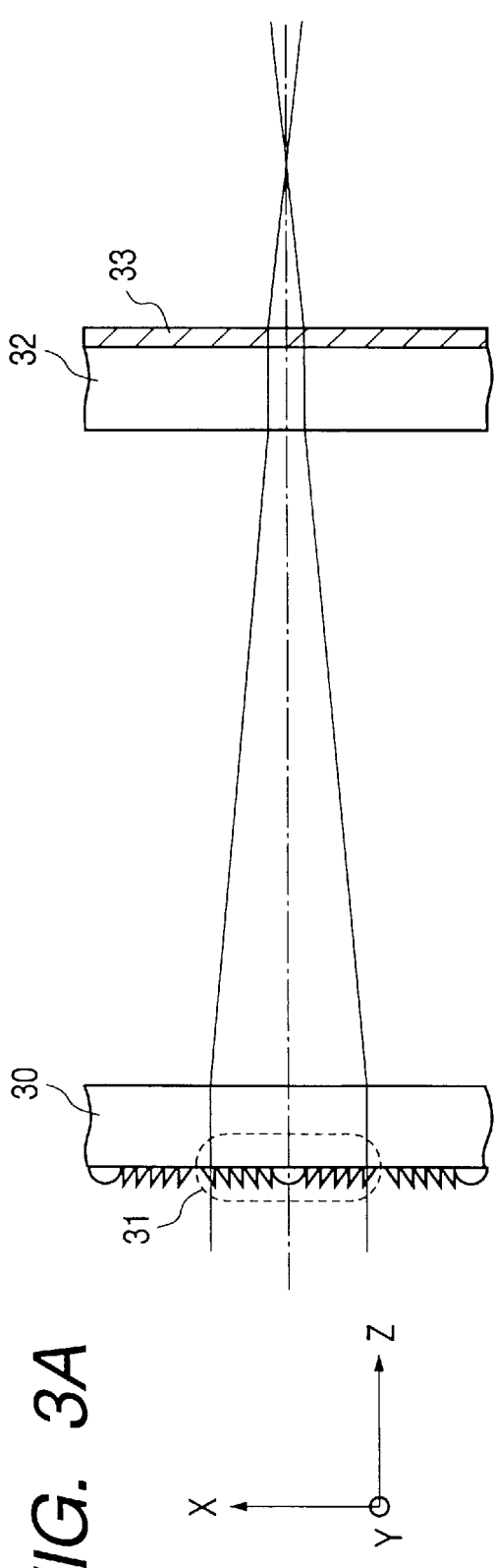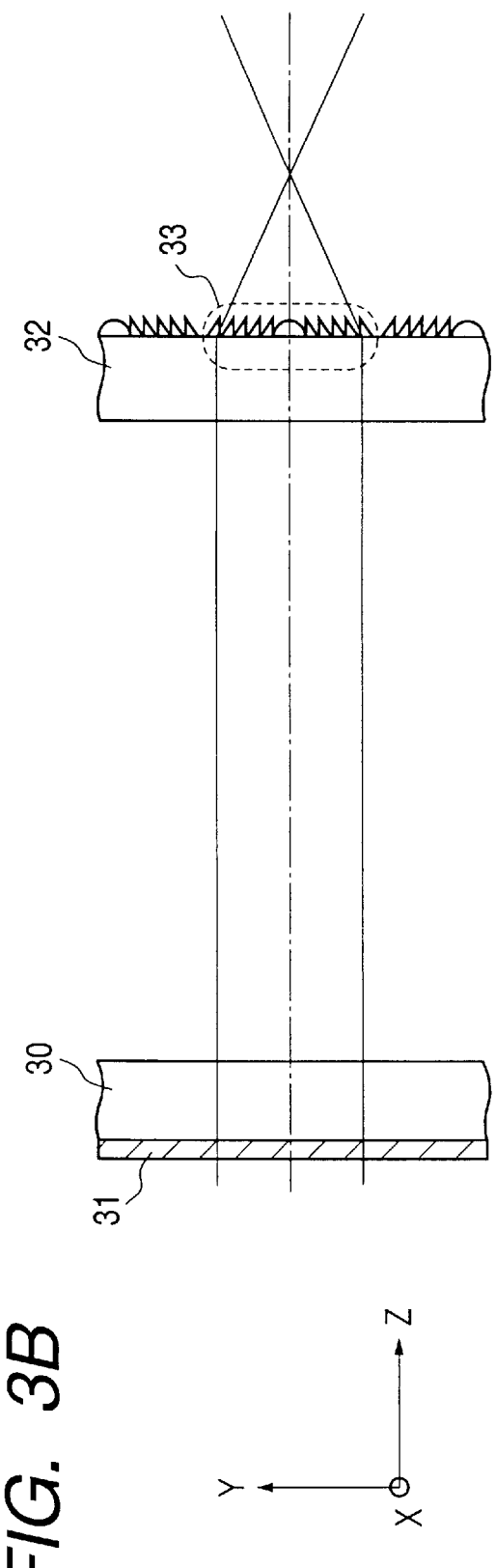

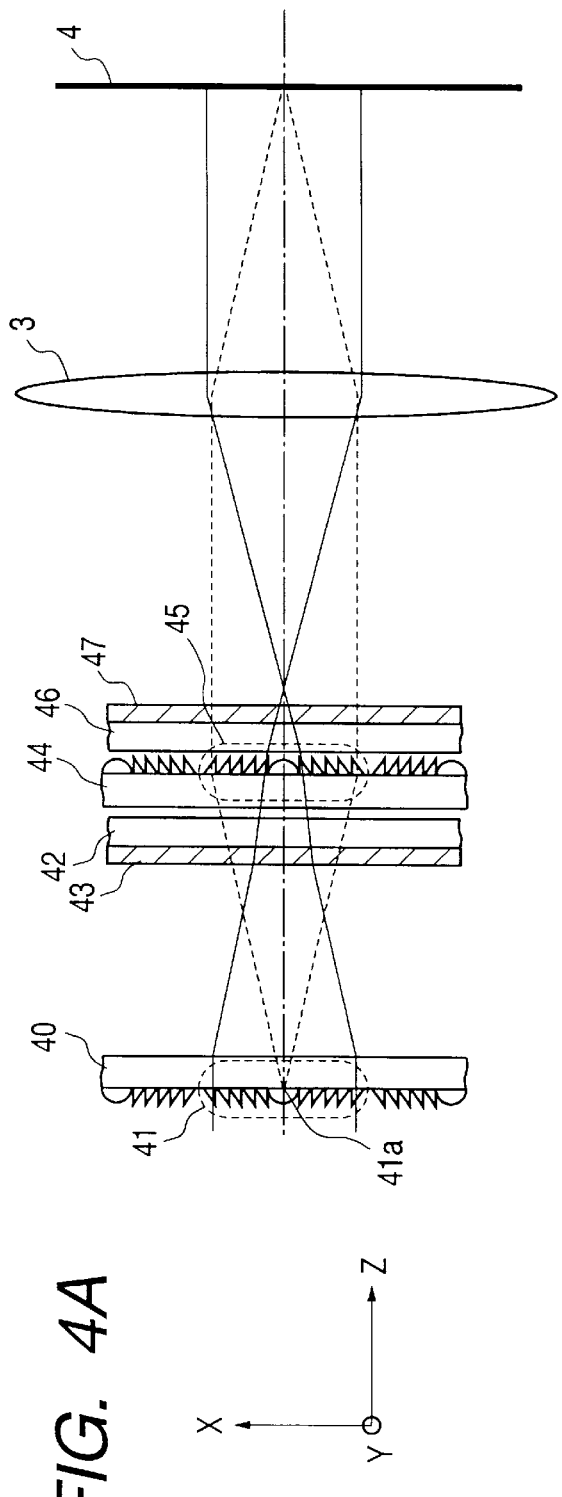
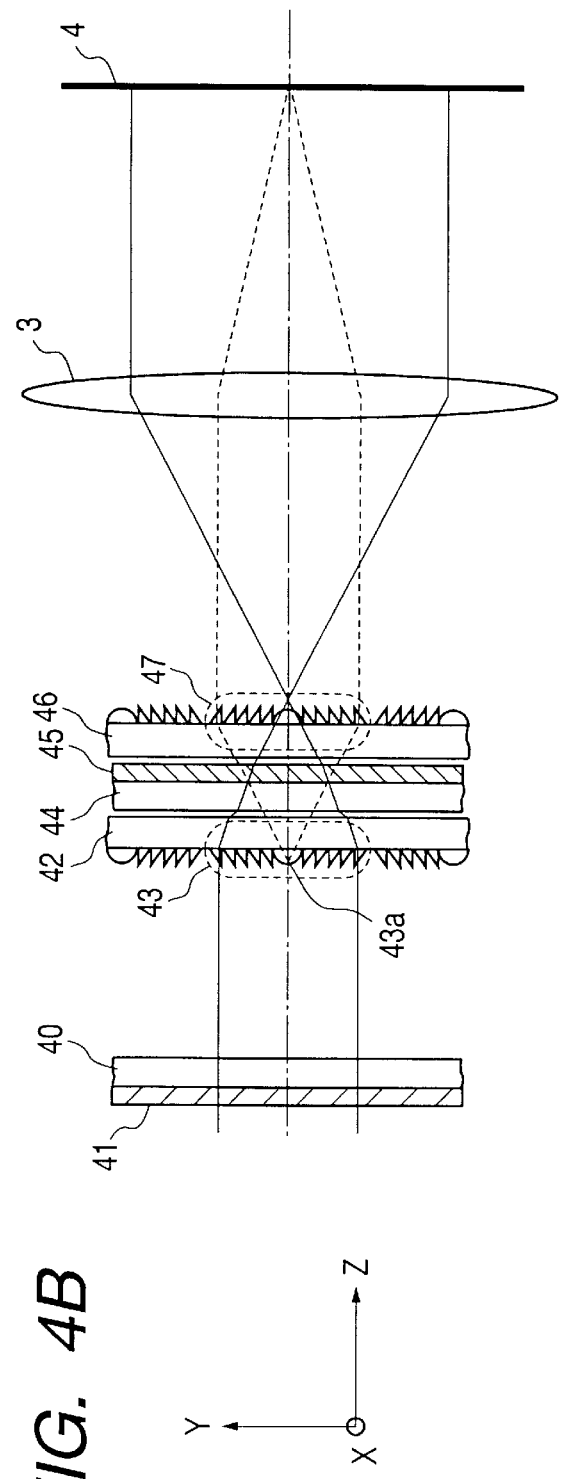
FIG. 4A
FIG. 4B

ILLUMINATION OPTICAL SYSTEM AND EXPOSURE APPARATUS HAVING THE SAME

BACKGROUND OF THE INVENTION

1. Field of the Invention

The present invention relates to an illumination optical system and a projection exposure apparatus using the same.

2. Related Background Art

In recent years, the micropatterning techniques of semiconductor wafers have been greatly improved to realize highly integrated semiconductor devices such as ICs, LSIs, and the like. As principal projection exposure apparatuses of such micropatterning techniques, known are an equal-magnification projection exposure apparatus (mirror projection aligner) that performs exposure while scanning a reticle and a photosensitive substrate with respect to an equal-magnification mirror optical system having an arcuate exposure range, a reduction projection exposure apparatus (stepper) that forms a pattern image of a reticle on a photosensitive substrate by a refractive optical system to expose the photosensitive substrate by a step-and-repeat scheme, and the like. Also known is a step-and-scan type scanning projection exposure apparatus that can obtain a high resolution and can increase the screen size.

In the stepper, a reticle on which an electronic circuit pattern is formed to have a size m times the required size is illuminated by an illumination optical system, and the pattern on the reticle is projected onto the wafer surface at a reduced scale of 1/mx by a projection optical system. The scanning projection exposure apparatus employs a projection optical system for transferring a portion of the pattern on the reticle onto the wafer, an illumination optical system for illuminating the portion of the pattern on the reticle by forming a slit-like light beam, and a scan mechanism for scanning the reticle and wafer at a predetermined speed ratio with respect to the slit-like light beam and the projection optical system so as to scan and expose a pattern on a reticle onto a wafer.

A reticle formed with an electronic circuit pattern normally has a rectangular shape, and its pattern region has various sizes. On the other hand, the effective illumination range of the illumination optical system that illuminates the reticle surface in the projection exposure apparatus normally has a circular shape. For this reason, upon projecting and exposing the reticle pattern onto the wafer surface, a portion of the effective illumination range is shielded by a masking mechanism or the like to obtain a rectangular light beam similar to the reticle pattern shape. As described above, in the conventional projection exposure apparatus, since the portion of the effective illumination range is shielded by the masking mechanism to illuminate the reticle surface, the illumination efficiency is low. In order to solve this problem, U.S. Pat. No. 4,682,885 discloses an optical integrator in which cylindrical lenses are arranged to cross each other so as to obtain an illumination range corresponding to an arcuate slit.

On the other hand, in recent years, in order to improve the resolution and focal depth, modified illumination stops having various shapes (e.g., a ring like shape) are arranged at the light exit side of the optical integrator. The optical integrator is used as a member for forming a plurality of secondary light sources in the vicinity of the exit sides of the individual elementary lenses that make up the integrator, and for forming a uniform illumination region by integrating light emanating from these secondary light sources.

However, when the number of the elementary lenses (corresponding to the number of secondary light sources) used in the optical integrator is reduced using a modified illumination stop, the uniformity of illumination lowers. In order to improve the uniformity of illumination, the diameters of the elementary lenses are reduced, and the number of elementary lenses used is increased. However, since the size of an elementary lens that can be manufactured is limited, it is difficult to increase the number of elementary lenses as conventional refractive optical elements.

SUMMARY OF THE INVENTION

It is an object of the present invention to provide an illumination optical system which can improve the utilization efficiency of an illumination light beam by forming the region to be illuminated into a desired shape, and can accomplish uniform illumination even when modified illumination or the like is used.

In order to achieve the above object, an illumination optical system of the present invention is characterized by comprising:

a first diffraction optical element having a plurality of micro diffraction optical elements, which have a first refractive power in a first direction; and a second diffraction optical element having a plurality of micro diffraction optical elements, which have a second refractive power in a second direction perpendicular to the first direction, wherein light supplied from a light source forms a plurality of secondary light sources after the light passes through the first and second diffraction optical elements, and the first refractive power is different from the second diffractive power.

A projection exposure apparatus of the present invention is characterized by comprising:

a light source;

an illumination optical system for guiding light supplied from the light source toward a reticle; and a projection optical system for projecting a pattern formed on the reticle onto a wafer, in which the illumination optical system includes:

a first diffraction optical element having a plurality of micro diffraction optical elements, which have a first refractive power in a first direction; and a second diffraction optical element having a plurality of micro diffraction optical elements, which have a second refractive power in a second direction perpendicular to the first direction, wherein light supplied from the light source forms a plurality of secondary light sources after the light passes through the first and second diffraction optical elements, and the first refractive power is different from the second refractive power.

A device manufacturing method of the present invention is characterized by including the steps of:

transferring a pattern formed on a reticle onto a wafer by exposure using a projection exposure apparatus of the present invention; and developing the wafer.

BRIEF DESCRIPTION OF THE DRAWINGS

FIGS. 1A and 1B are schematic plan views showing a principal part of the first embodiment of an illumination optical system according to the present invention;

FIGS. 2A and 2B are explanatory views of an optical integrator shown in FIGS. 1A and 1B;

FIGS. 3A and 3B are schematic, partial sectional views showing a principal part of the second embodiment of an illumination optical system according to the present invention;

FIGS. 4A and 4B are schematic, partial sectional views showing a principal part of the third embodiment of an illumination optical system according to the present invention;

DETAILED DESCRIPTION OF THE PREFERRED EMBODIMENTS

Figure 5:
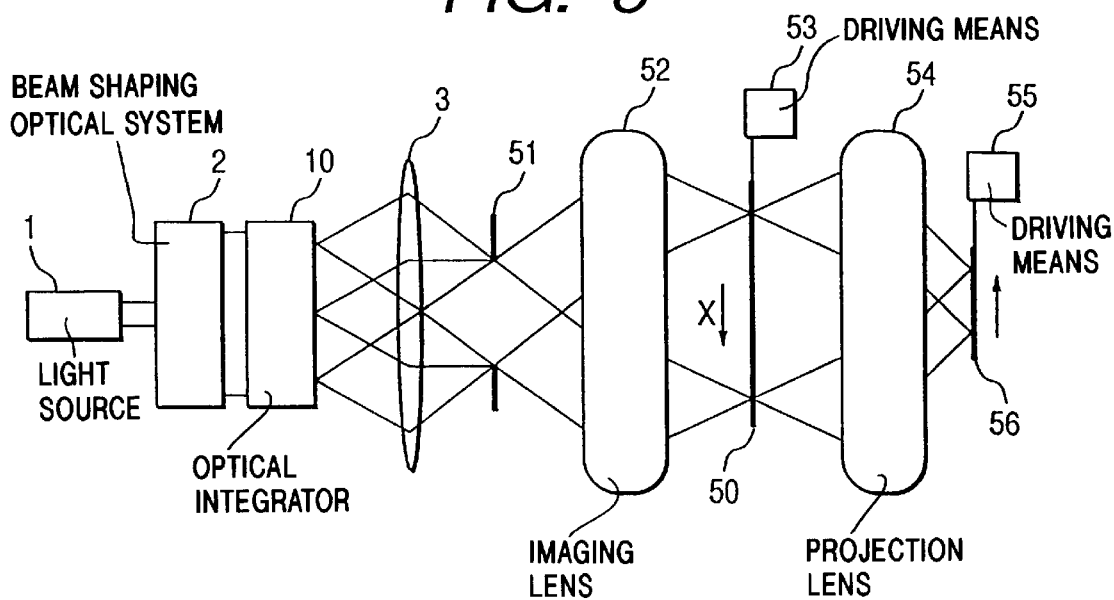
FIG. 5 is a schematic view showing a principal part of a projection exposure apparatus having the illumination optical system according to the present invention.

FIGS. 1A and 1B are schematic views showing a principal part of the first embodiment of an illumination optical system according to the present invention. FIG. 1A shows an X-Z plane as a first plane, and FIG. 1B shows a Y-Z plane as a second plane.

Referring to FIGS. 1A and 1B, a light source 1 uses a mercury lamp, excimer laser, or the like. A beam shaping optical system 2 includes a beam compressor, and the like. The beam shaping optical system 2 shapes a light beam coming from the light source 1 into a desired beam shape, and directs the shaped light beam onto a light incident surface 10a of an optical integrator 10 serving as a homogenizer. As will be described later, the optical integrator 10 has two diffraction optical elements, i.e., first and second diffraction optical elements which respectively have different refractive powers in the X-Z plane in FIG. 1A and different refractive powers in the Y-Z plane in FIG. 1B, and have a plurality of micro diffraction optical elements, and forms a plurality of secondary light sources on its light exit surface 10b. A condenser lens 3 condenses light beams emanating from the plurality of secondary light sources on the light exit surface 10b of the optical integrator 10 and illuminates a surface 4 to be irradiated by superposing the light beams. The surface 4 is Köhler-illuminated by the condenser lens 3.

In the illumination optical system of this embodiment, a light beam emanating from the light source 1 is converted into a desired light beam diameter by the beam shaping optical system, and thereafter, the shaped light beam is incident on the light incident surface 10a of the optical integrator 10, thus forming a plurality of secondary light sources on the light exit surface 10b. Light beams emanating from the individual secondary light sources on the light exit surface 10b Köhler-illuminate the surface 4 to be irradiated via the condenser lens 3. At this time, the optical integrator 10 is designed to have different numerical apertures θx and θy in the X-Z plane (FIG. 1A) and the Y-Z plane (FIG. 1B), thereby defining different widths Dx and Dy of the illumination region in these planes.

FIGS. 2A and 2B are sectional views showing a principal part of the optical integrator 10 shown in FIGS. 1A and 1B. FIG. 2A shows the X-Z plane, and FIG. 2B shows the Y-Z plane.

As shown in FIGS. 2A and 2B, in the optical integrator 10 of this embodiment, a large number of micro diffraction optical elements 21 (focal length fix), which have power in only the X-Z plane in FIG. 2A and have gratings extending in the Y-direction, are arranged on the front side (the light source 1 side) of a single substrate 20. On the other hand, a large number of micro diffraction optical elements 22 (focal length fiy), which have power in only the Y-Z plane in FIG. 2B and have gratings extending in the X-direction, are arranged on the rear side of the substrate 20. Sets of these micro diffraction optical elements 21 and 22 respectively form first and second diffraction optical elements. Note that the focal lengths fix and fiy satisfy fix>fiy and both assume positive values.

As shown in FIGS. 2A and 2B, the refractive powers of the micro diffraction optical elements 21 and 22, the thickness of the substrate 20, the refractive index of the substrate material, and the like are adjusted, so that the focal point positions of light beams passing through the micro diffraction optical elements 21 and 22 substantially coincide with each other in the X-Z plane (first plane) and the Y-Z plane (second plane), thus efficiently forming an illumination region with a predetermined shape.

The micro diffraction optical elements of this embodiment are fabricated by a photolithography technique, and elements smaller than a conventional elementary lens fabricated by polishing and the like can be easily obtained. For this reason, the number of elements can be greatly increased and, hence, the number of secondary light sources can be greatly increased, thus accomplishing illumination with higher uniformity.

FIGS. 3A and 3B are sectional views showing a principal part of an optical integrator that constitutes an illumination optical system according to the second embodiment of the present invention. FIG. 3A shows an X-Z plane, and FIG. 3B shows a Y-Z plane.

As shown in FIGS. 3A and 3B, in the optical integrator of this embodiment, a large number of micro diffraction optical elements 31 (focal length fixa), which have power in only the X-Z plane and have gratings extending in the Y-direction, are arranged on the front side of a first substrate 30. On the other hand, a large number of micro diffraction optical elements 33 (focal length fiya), which have power in only the Y-Z plane and have gratings extending in the X-direction, are arranged on the rear side of a second substrate 32. Sets of these micro diffraction optical elements 31 and 33 respectively form first and second diffraction optical elements. Note that the focal lengths fixa and fiya satisfy fixa>fiya and both take on positive values.

The refractive powers of the micro diffraction optical elements 31 and 33, and the thicknesses of the substrates 30 and 32 or the interval between the substrates 30 and 32, or both of them are adjusted, so that the focal point positions of light beams passing through the micro diffraction optical elements 31 and 33 coincide with each other, thus efficiently forming an illumination region with a predetermined shape.

In the first embodiment, as the difference between the focal lengths fix and fiy becomes larger, the thickness of the substrate increases. In contrast with this, in this embodiment, the first and second diffraction optical elements are arranged on different substrates, and a gap without any glass material is formed between the two substrates, thereby decreasing the thicknesses of the substrate. In this manner, absorption of ultraviolet rays can be suppressed.

FIGS. 4A and 4B are sectional views showing a principal part of an optical integrator and subsequent elements that constitute the third embodiment of the present invention. FIG. 4A shows an X-Z plane, and FIG. 4B shows a Y-Z plane. The same reference numerals in FIGS. 4A and 4B denote the same parts as in FIGS. 1A and 1B.

In this embodiment, as shown in FIG. 4A, a large number of micro diffraction optical elements 41 and 45, which have power in only the X-Z plane and have gratings extending in the Y-direction, are respectively arranged on the front side of a first substrate 40 and the rear side of a third substrate 44, and a desired focal length fixb is obtained by synthesizing the focal lengths of the micro diffraction optical elements 41 and 45. The first substrate 40 on the light source side and a surface 4 to be irradiated are arranged to have an optically conjugate relationship therebetween. More specifically, in this embodiment, the first and third substrates 40 and 44 serve as diffraction optical elements respectively formed with a plurality of micro diffraction optical elements 41 and 45, and these two diffraction optical elements constitute a first diffraction optical element of the present invention. Similarly, as shown in FIG. 4B, a large number of micro diffraction optical elements 43 and 47, which have power in only the Y-Z plane and have gratings extending in the X-direction, are respectively arranged on the front side of a second substrate 42 and the rear side of a fourth substrate 46, and a desired focal length fiyb is obtained by synthesizing the focal lengths of the micro diffraction optical elements 43 and 47. The second substrate 42 on the light source side and the surface 4 to be irradiated are arranged to have an optically conjugate relationship therebetween. More specifically, in this embodiment, the second and fourth substrates 42 and 46 serve as diffraction optical elements respectively formed with a plurality of micro diffraction optical elements 43 and 47, and these two diffraction optical elements constitute a second diffraction optical element of the present invention. Note that the focal lengths fixb and fiyb satisfy fixb>fiyb, and both assume positive values.

The first and second diffraction optical elements are designed such that the diffraction optical elements on their incident side are optically conjugate with the surface 4 to be irradiated and can guide light rays incident on each diffraction optical element within an identical illumination region even if the rays are tilted, thereby efficiently forming an illumination region.

In this embodiment, the surfaces that make up the first diffraction optical element and the surfaces that make up the second diffraction optical element are alternately arranged. However, the present invention is not particularly limited to such a specific arrangement, but an optical arrangement may be determined depending on the focal lengths fixb and fiyb.

In the above-mentioned first to third embodiments of the illumination optical system, the surface 4 to be irradiated is arranged behind the condenser lens, and is illuminated. Furthermore, an imaging system such as a relay lens may be inserted between the condenser lens and the surface 4. In this case, the position of the surface to be irradiated in FIGS. 1A and 1B is defined as a stop surface, and the stop surface and the surface to be irradiated are set at conjugate positions, thereby forming an illumination region having a shape similar to the stop surface shape on the surface to be irradiated. In this manner, the illumination region shape can be defined more accurately.

On the other hand, when binary optical elements each having a stepwise sectional shape of four levels, eight levels, or the like are formed as the micro diffraction optical elements, very small diffraction optical elements can be formed using a photolithography technique. Also, a light amount adjustment member or coherence reduction member may be arranged between the light source 1 and the optical integrator 10 as needed.

FIG. 5 is a schematic view showing a principal part of a projection exposure apparatus using the illumination optical system of the present invention. In FIG. 5, the apparatus includes a light source 1, a beam shaping optical system 2, an optical integrator 10, and a condenser lens 3, which are the same as those used in the illumination optical system shown in FIGS. 1A and 1B.

A stop 51 corresponds to the position of the surface 4 to be irradiated in FIGS. 1A and 1B. A stop imaging lens 52 projects the aperture shape of the stop 51 onto a reticle 50 arranged on the surface to be irradiated. An illumination region on the surface of the reticle 50 has a shape similar to the aperture shape of the stop 51. A projection lens (projection optical system) 54 projects a pattern on the surface of the reticle 50 onto the surface of a photosensitive substrate (wafer) 56. A driving means 53 drives the reticle 50. Also, a driving means 55 drives the wafer 56.

In this embodiment, the circuit pattern on the reticle 50 is projected by exposure onto the wafer 56 applied with a photosensitive member such as a resist via the projection lens 54 by a step-and-scan scheme. The step-and-scan exposure apparatus does not simultaneously illuminate the pattern on the reticle 50 but has, e.g., a slit-like illumination area. A pattern portion on the reticle 50 located within the illumination area is transferred onto an exposure area on the wafer 56 via the projection lens 54.

The reticle 50 is placed on a reticle stage to scan in, e.g., the X-direction by the driving means 53. The wafer 56 is placed on a movable stage to scan by the driving means 55 in a direction opposite to the X-direction of the reticle 50. Note that the reticle 50 and the wafer 56 synchronously scan in opposing directions at a speed ratio corresponding to the projection magnification of the projection lens 54.

An embodiment of a method of manufacturing a semiconductor device using the above-mentioned projection exposure apparatus will be explained below.

Figure 6:
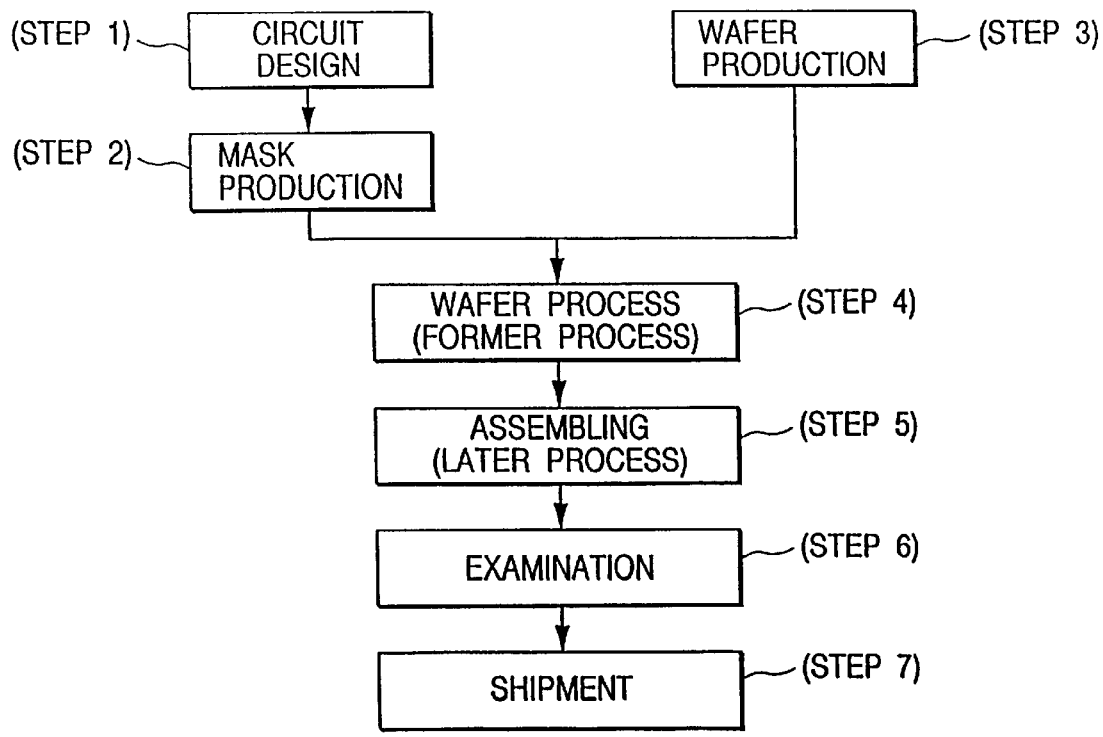
FIG. 6 is a flow chart showing the processes in the manufacture of a semiconductor device.

FIG. 6 is a flow chart showing the processes in the manufacture of a semiconductor device (e.g., a semiconductor chip such as an IC, LSI, or the like, or a liquid crystal panel, CCD, or the like).

In step 1 (circuit design), the circuit design of a semiconductor device is made. In step 2 (mask production), a mask formed with the designed circuit pattern is produced. In step 3 (wafer production), a wafer is produced using materials such as silicon and the like. Step 4 (wafer process) is called a former (pre) process, and an actual circuit is formed by a lithography technique on the wafer using the prepared wafer and mask.

The next step 5 (assembling) is called a later (post) process, in which semiconductor chips are assembled using the wafer obtained in step 4, and includes an assembly process (dicing, bonding), a packaging process (encapsulating chips), and the like.

In step 6 (examination), examinations such as performance confirmation tests, durability tests, and the like of the semiconductor devices assembled in step 5 are conducted. Semiconductor devices are completed via these processes, and are shipped (step 7).

Figure 7:
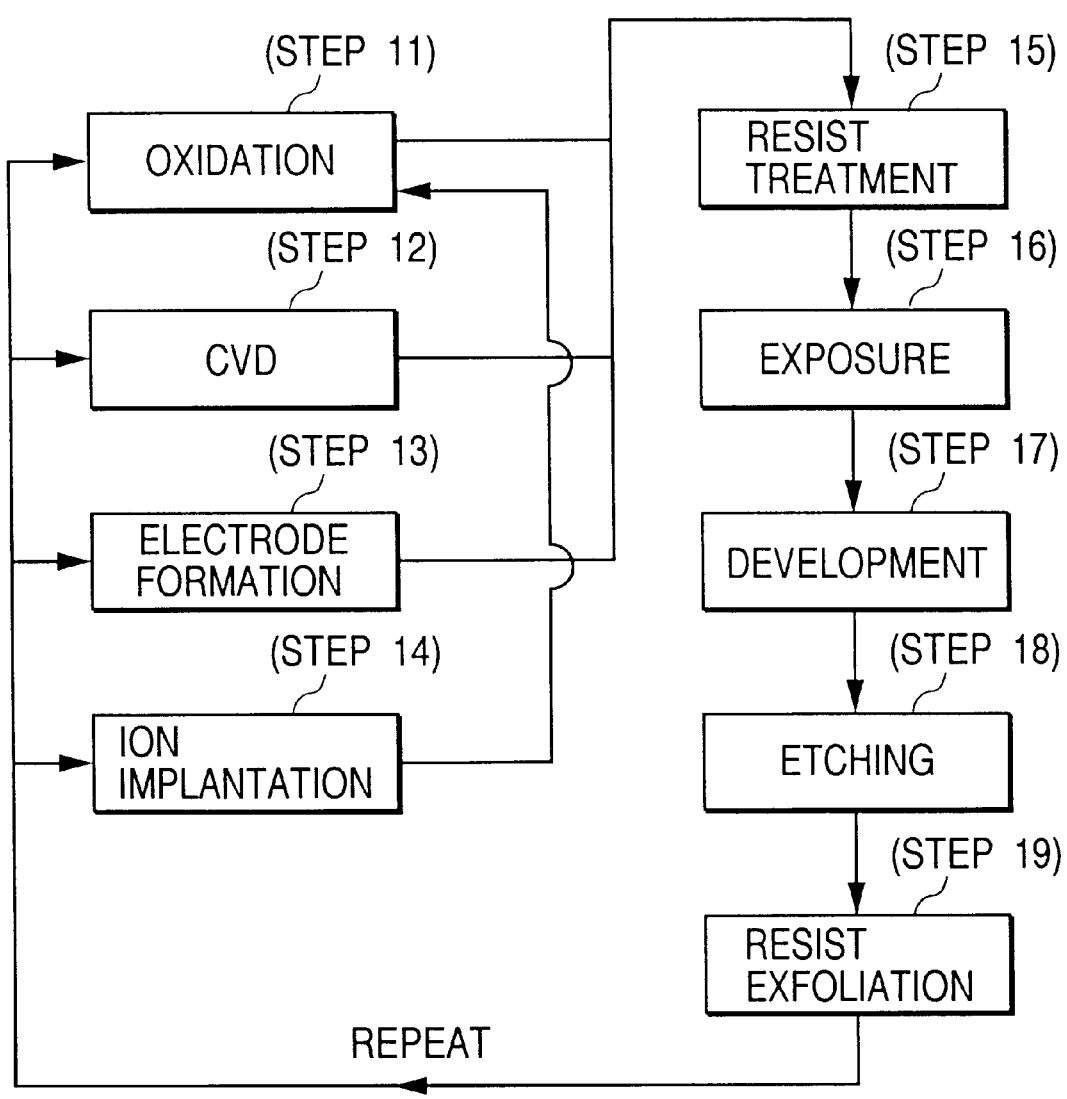
FIG. 7 is a flow chart showing the wafer process among those in FIG. 6 in detail.

FIG. 7 is a flow chart showing the wafer process in detail. In step 11 (oxidation), the surface of the wafer is oxidized. In step 12 (CVD), an insulating film is formed on the wafer surface.

In step 13 (electrode formation), electrodes are formed by evaporation on the wafer. In step 14 (ion implantation), ions are implanted into the wafer. In step 15 (resist treatment), a photosensitive agent is applied on the wafer. In step 16 (exposure), the circuit pattern on the mask is printed on the wafer by exposure using the above-mentioned exposure apparatus.

In step 17 (development), the exposed wafer is developed. In step 18 (etching), a portion other than the developed resist image is removed by etching. In step 19 (resist exfoliation), the resist which becomes unnecessary after etching is exfoliated. By executing these steps repetitively, multiple circuit patterns are formed on the wafer.

According to the manufacturing method of this embodiment, a highly integrated semiconductor device, which is not easy to manufacture by the conventional method, can be easily manufactured.

What is claimed is:

1. An illumination optical system comprising:
   a first diffraction optical element having a plurality of micro diffraction optical elements, which have a first optical power in a first direction and an optical power different from the first optical power in a second direction, perpendicular to the first direction;
   a second diffraction optical element having a plurality of micro diffraction optical elements, which have a second optical power in the second direction and an optical power different from the second optical power in the first direction, wherein light supplied from a light source forms a plurality of secondary light sources by passing through said first and second diffraction optical elements, and the first optical power is different from the second optical power; and
   a condenser lens, light from the secondary light sources passing through which generates Köhler illumination on a surface to be irradiated.

2. A system according to claim 1, wherein the plurality of micro diffraction optical elements of said first diffraction optical element have a refractive power in only the first direction, and the plurality of micro diffraction optical elements of said second diffraction optical element have a refractive power in only the second direction.

3. A system according to claim 1, further comprising a transparent substrate, on both surfaces of which, said first and second diffraction optical elements are respectively formed.

4. A system according to claim 1, further comprising:
   a first transparent substrate on one surface of which said first diffraction optical element is formed; and
   a second transparent substrate on one surface of which said second diffraction optical element is formed.

5. A system according to claim 1, wherein said first diffraction optical element is constituted by a plurality of diffraction optical elements arranged in a traveling direction of light, and
   said second diffraction optical element is constituted by a plurality of diffraction optical elements arranged in the traveling direction of the light.

6. A system according to claim 5, wherein the diffraction optical element, closest to the light source, of the plurality of diffraction optical elements constituting said first diffraction optical element is positioned to be conjugate with a surface to be irradiated, and
   the diffraction optical element, closest to the light source, of the plurality of diffraction optical elements constituting said second diffraction optical element is positioned to be conjugate with the surface to be irradiated.

7. A projection exposure apparatus comprising:
   a light source;
   an illumination optical system for guiding light supplied from said light source toward a reticle; and
   a projection optical system for projecting a pattern formed on the reticle onto a wafer,
   wherein said illumination optical system comprises:
      a first diffraction optical element having a plurality of micro diffraction optical elements, which have a first optical power in a first direction and which have an optical power different from the first optical power in a second direction, perpendicular to the first direction;
      a second diffraction optical element having a plurality of micro diffraction optical elements, which have a second optical power in the second direction and which have an optical power different from the second optical power in the first direction, wherein light supplied from said light source forms a plurality of secondary light sources by passing through said first and second diffraction optical elements, and the first optical power is different from the second optical power; and
      a condenser lens, light from the secondary light sources passing through which generates Köhler illumination on a surface to be irradiated.

8. An apparatus according to claim 7, wherein the plurality of micro diffraction optical elements of said first diffraction optical element have a refractive power in only said first direction, and the plurality of micro diffraction optical elements of said second diffraction optical element have a refractive power in only said second direction.

9. An apparatus according to claim 7, further comprising a transparent substrate, on both surfaces of which, said first and second diffraction optical elements are respectively formed.

10. An apparatus according to claim 7, further comprising:
    a first transparent substrate on one surface of which said first diffraction optical element is formed; and
    a second transparent substrate on one surface of which said second diffraction optical element is formed.

11. An apparatus according to claim 7, wherein said first diffraction optical element is constituted by a plurality of diffraction optical elements arranged in a traveling direction of light, and
    said second diffraction optical element is constituted by a plurality of diffraction optical elements arranged in the traveling direction of the light.

12. An apparatus according to claim 11, wherein a diffraction optical element, closest to said light source, of the plurality of diffraction optical elements constituting said first diffraction optical element is positioned to be conjugate with a surface to be irradiated, and
    a diffraction optical element, closest to said light source, of the plurality of diffraction optical elements constituting said second diffraction optical element is positioned to be conjugate with the surface to be irradiated.

13. A device manufacturing method comprising the steps of:
    providing a projection exposure apparatus comprising:
       a light source;
       an illumination optical system for guiding light supplied from the light source toward a reticle; and
       a projection optical system for projecting a pattern formed on the reticle onto a wafer,
    wherein the illumination optical system comprises:
       a first diffraction optical element having a plurality of micro diffraction optical elements, which have a first optical power in a first direction and which have an optical power different from the first optical power in a second direction, perpendicular to the first direction;

a second diffraction optical element having a plurality of micro diffraction optical elements, which have a second optical power in the second direction and which have an optical power different from the second optical power in the first direction, wherein light supplied from the light source forms a plurality of secondary light sources by passing through the first and second diffraction optical elements, and the first optical power is different from the second optical power; and a condenser lens, light from the secondary light sources passing through which generates Köhler illumination on a surface to be irradiated;

transferring a pattern formed on the reticle onto the wafer by exposure using the projection exposure apparatus; and developing the wafer.

14. A method according to claim 13, wherein the plurality of micro diffraction optical elements of the first diffraction optical element have a refractive power in only the first direction, and the plurality of micro diffraction optical elements of the second diffraction optical element have a refractive power in only the second direction.

15. A method according to claim 13, further comprising providing a transparent substrate, on both surfaces of which, the first and second diffraction optical elements are respectively formed.

16. A method according to claim 13, further comprising:

providing a first transparent substrate, on one surface of which, the first diffraction optical element is formed; and providing a second transparent substrate, on one surface of which, the second diffraction optical element is formed.

17. A method according to claim 13, wherein the first diffraction optical element is constituted by a plurality of diffraction optical elements arranged in a traveling direction of light, and the second diffraction optical element is constituted by a plurality of diffraction optical elements arranged in the traveling direction of light.

18. A method according to claim 13, wherein a diffraction optical element, closest to the light source, of the plurality of diffraction optical elements constituting the first diffraction optical element is positioned to be conjugate with a surface to be irradiated, and a diffraction optical element, closest to the light source, of the plurality of diffraction optical elements constituting the second diffraction optical element is positioned to be conjugate with the surface to be irradiated.

* * * * *